(12) United States Patent
Elgaard et al.

(10) Patent No.: US 10,848,108 B2
(45) Date of Patent: Nov. 24, 2020

(54) POWER AMPLIFIER

(71) Applicant: Telefonaktiebolaget LM Ericsson (publ), Stockholm (SE)

(72) Inventors: Christian Elgaard, Lund (SE); Stefan Andersson, Flyinge (SE); Andreas Axholt, Lund (SE); Imad ud Din, Flyinge (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 16/340,503

(22) PCT Filed: Oct. 14, 2016

(86) PCT No.: PCT/EP2016/074799
§ 371 (c)(1),
(2) Date: Apr. 9, 2019

(87) PCT Pub. No.: WO2018/068871
PCT Pub. Date: Apr. 19, 2018

(65) Prior Publication Data
US 2019/0245493 A1 Aug. 8, 2019

(51) Int. Cl.
*H03F 1/32* (2006.01)
*H03F 3/24* (2006.01)
(Continued)

(52) U.S. Cl.
CPC ......... *H03F 1/3205* (2013.01); *H03F 1/0233* (2013.01); *H03F 1/0266* (2013.01); *H03F 1/0272* (2013.01); *H03F 1/3211* (2013.01);
*H03F 1/3223* (2013.01); *H03F 1/342* (2013.01); *H03F 3/195* (2013.01); *H03F 3/213* (2013.01);
(Continued)

(58) Field of Classification Search
CPC combination set(s) only.
See application file for complete search history.

(56) References Cited

U.S. PATENT DOCUMENTS 5,420,536 A * 5/1995 Faulkner ............... H03C 3/406
330/129
6,127,892 A 10/2000 Komurasaki et al.
(Continued)

OTHER PUBLICATIONS

Ghajar, R. et al., "Backgate Modulation Technique for Higher Efficiency Envelope Tracking", IEEE Transactions on Microwave Theory and Techniques, vol. 61, No. 4, Apr. 1, 2013, pp. 1599-1607, IEEE.

*Primary Examiner* — Junpeng Chen
(74) *Attorney, Agent, or Firm* — Patent Portfolio Builders, PLLC

(57) ABSTRACT

A power amplifier (20) for a transmitter circuit (10) is disclosed. The power amplifier (20) comprises at least one field-effect transistor (100, 100n, 100p) having a gate terminal (110, 110n, 110p) and a bulk terminal (120, 120n, 120p), wherein the at least one field-effect transistor (100, 100n, 100n) is configured to receive an input voltage at the gate terminal (110, 110p, 110n) and a dynamic bias voltage at the bulk terminal (120, 120n, 120p). Furthermore, the power amplifier (20) comprises a bias-voltage generation circuit (130). The input voltage is a linear function of an input signal. The bias-voltage generation circuit (130) is configured to generate the dynamic bias voltage as a non-linear function of an envelope of the input signal.

18 Claims, 10 Drawing Sheets

(51) Int. Cl.

| | | |
|---|---|---|
| H03F 3/45 | (2006.01) | |
| H03F 1/02 | (2006.01) | |
| H04B 1/04 | (2006.01) | |
| H03F 3/195 | (2006.01) | |
| H03F 3/213 | (2006.01) | |
| H03F 1/34 | (2006.01) | |

(52) U.S. Cl.
CPC ......... *H03F 3/245* (2013.01); *H03F 3/45179* (2013.01); *H04B 1/04* (2013.01); *H03F 2200/09* (2013.01); *H03F 2200/105* (2013.01); *H03F 2200/135* (2013.01); *H03F 2200/321* (2013.01); *H03F 2200/451* (2013.01); *H03F 2200/541* (2013.01); *H03F 2200/555* (2013.01); *H03F 2200/75* (2013.01); *H03F 2203/45071* (2013.01); *H04B 2001/045* (2013.01); *H04B 2001/0416* (2013.01)

(56) References Cited

U.S. PATENT DOCUMENTS

| | | |
|---|---|---|
| 7,893,766 B1 | 2/2011 | Cranford, Jr. et al. |
| 2003/0076172 A1 | 4/2003 | Tichauer |
| 2005/0090209 A1* | 4/2005 | Behzad ................ H03F 1/0261 455/115.1 |
| 2015/0244326 A1* | 8/2015 | Jeong .................. H03F 1/0266 330/296 |
| 2016/0276982 A1 | 9/2016 | Kang et al. |

* cited by examiner

POWER AMPLIFIER

TECHNICAL FIELD

The present invention relates to a power amplifier.

BACKGROUND

Power amplifiers are used in basically all wireless communication systems. One of the key parameters of a power amplifier is its linearity and compression point. Nonlinear transfer function of an amplifier will create intermodulation products and harmonic distortion. In general terms amplifiers can be linearized using a few methods, which are; negative feedback, increased bias to signal ratio, error feed forward and predistortion. If the nonlinearity is known, then predistortion can be used to linearize it. Digital predistortion of the transmitted signal is commonly used to linearize the output in cellular systems.

Some integrated circuit manufacturing process technologies allows the bulk terminal, or back-gate terminal, of individual transistors to be biased individually. An example of this is in the context of power amplifiers is presented in M. R. Ghajar et al "Backgate Modulation Technique for Higher Efficiency Envelope Tracking", *IEEE Transactions on Microwave Theory and Techniques*, vol. 61, no. 4, pp. 1599-1607, April 2013. One such type of manufacturing process technology is commonly referred to as silicon-on-insulator (SOI) technology, wherein transistors are formed in a thin layer of silicon on top of a substrate of an insulating material.

SUMMARY

The inventors have realized that linearization of a power amplifier can be facilitated in an efficient way by driving the bulk node of an input transistor of the power amplifier with a dynamic bias voltage, which is a nonlinear function of the envelope of the input signal of the power amplifier. In addition, doing so enables a relatively high compression point of the power amplifier.

According to a first aspect, there is provided a power amplifier for a transmitter circuit. The power amplifier comprises at least one field-effect transistor having a gate terminal and a bulk terminal, wherein the at least one field-effect transistor is configured to receive an input voltage at the gate terminal and a dynamic bias voltage at the bulk terminal. Furthermore, the power amplifier comprises a bias-voltage generation circuit. The input voltage is a linear function of an input signal. The bias-voltage generation circuit is configured to generate the dynamic bias voltage as a nonlinear function of an envelope of the input signal.

In some embodiments, the at least one field-effect transistor is an NMOS transistor and the nonlinear function is an increasing function. In some embodiments, the at least one field-effect transistor is a PMOS transistor and the nonlinear function is a decreasing function.

The bias-voltage generation circuit may comprise a digital signal-processing circuit configured to apply the nonlinear function in the digital domain to generate a digital bias signal, and a digital-to-analog converter configured to convert the digital bias signal to the analog domain to generate the dynamic bias voltage.

The bias-voltage generation circuit may be an analog circuit. For example, the bias-voltage generation circuit may comprise a rectifier circuit configured to generate a rectified input voltage and an amplifier circuit operatively connected to the rectifier circuit and configured to generate the dynamic bias voltage based on the rectified input voltage. The bias-voltage generation circuit may comprise a filter circuit connected between the rectifier circuit and the amplifier circuit. The amplifier circuit may be a variable-gain amplifier circuit. The power amplifier may comprise a control circuit configured to tune the gain of the amplifier circuit.

The at least one field-effect transistor may be fabricated in a silicon-on-insulator process technology.

The at least one field-effect transistor may be a differential pair of field-effect transistors.

According to a second aspect, there is provided a transmitter circuit comprising the power amplifier according to the first aspect.

According to a third aspect, there is provided a communication apparatus comprising the transmitter circuit according to the second aspect. The communication apparatus may e.g. be a wireless terminal for a cellular communication system or a radio base station for a cellular communication system.

According to a fourth aspect, there is provided a method of controlling a power amplifier for a transmitter circuit. The power amplifier comprises at least one field-effect transistor having a gate terminal and a bulk terminal. The at least one field effect transistor is configured to receive an input voltage at the gate terminal and a dynamic bias voltage at the bulk terminal. The method comprises generating the input voltage as a linear function of an input signal. Furthermore, the method comprises generating the dynamic bias voltage as a nonlinear function of an envelope of the input signal.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
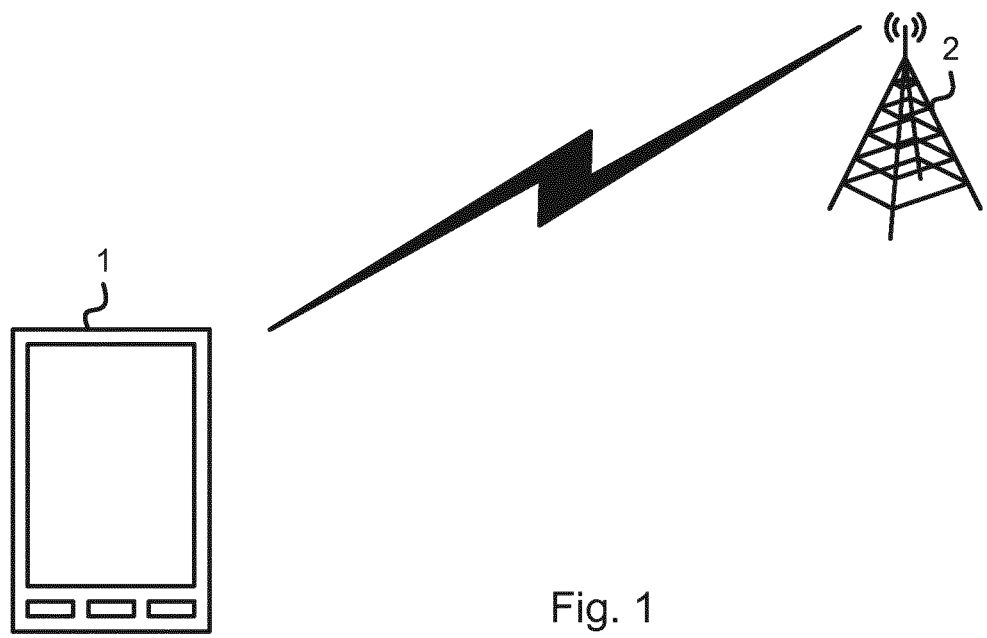
FIG. 1 illustrates a communication environment.

FIG. 1 illustrates a communication environment wherein embodiments of the present invention may be employed. A wireless terminal 1 of a cellular communications system is in wireless communication with a radio base station 2 of the cellular communications system. The wireless terminal 1 may be what is generally referred to as a user equipment (UE). The wireless terminal 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present invention may be applicable in other types of systems as well, such as but not limited to WiFi systems.

The radio base station 2 and wireless terminal 1 are examples of what in this disclosure is generically referred to as communication apparatuses. Embodiments are described below in the context of a communication apparatus in the form of the radio base station 2 or wireless terminal 1. However, other types of communication apparatuses can be considered as well, such as a WiFi access point or WiFi enabled device.

Figure 2:
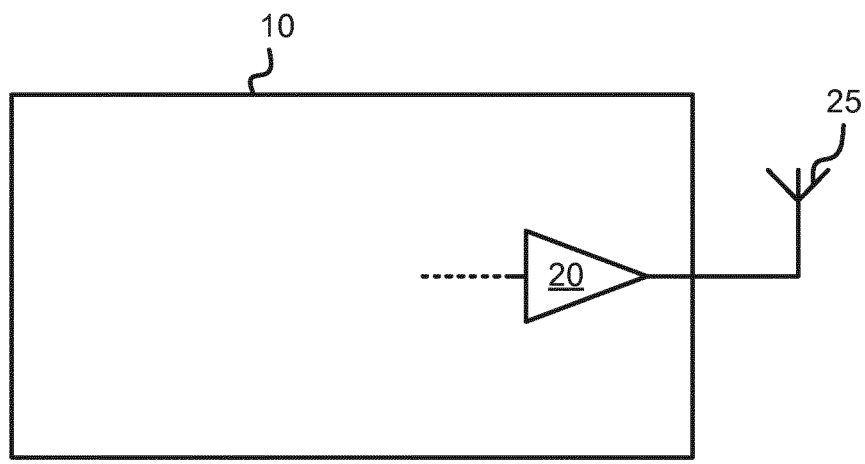
FIG. 2 illustrates a transmitter circuit.

FIG. 2 schematically illustrates a transmitter circuit 10, which may for instance be comprised in a communication apparatus such as the wireless terminal 1 or radio base station 2. It comprises a power amplifier 20 configured to feed a signal to be transmitted to a transmission antenna 25 of the communication apparatus. The power amplifier 20 may be preceded by various different circuitry, well known in the art of radio transmitter design, and the present disclosure is not limited to any particular such circuitry, as illustrated by the dotted line in FIG. 2.

Figure 3:
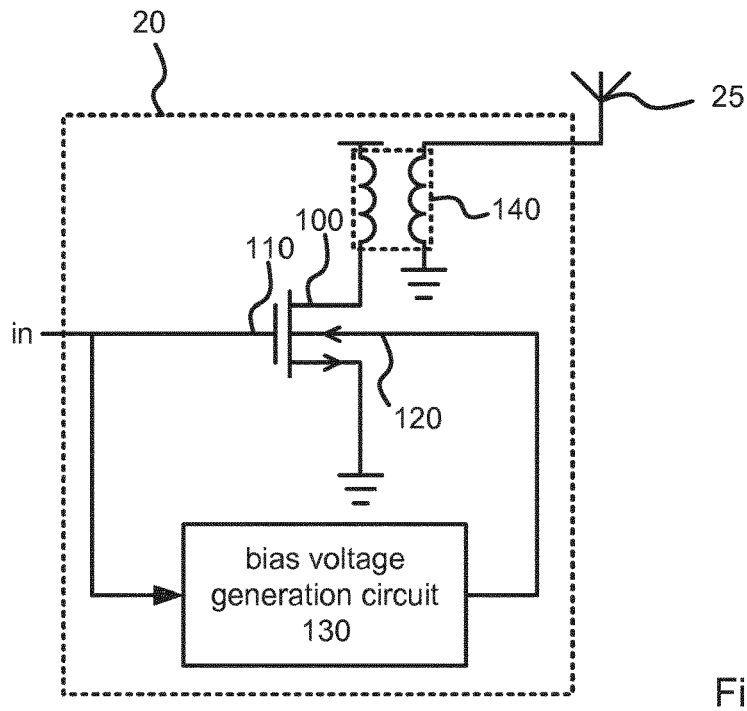
FIGS. 3-4 illustrate embodiments of a power amplifier.

FIG. 3 illustrates an embodiment of the power amplifier 20. It comprises a field-effect transistor 100. In FIG. 3, the illustrated field-effect transistor 100 is an NMOS transistor. In other embodiments, the field-effect transistor 100 may e.g. be a PMOS transistor. The field-effect transistor 100 is configured to receive an input voltage at its gate terminal 110 and a dynamic bias voltage at its bulk terminal 120. In FIG. 3, the gate terminal 110 of the field-effect transistor 100 is connected to an input "in" to receive the input voltage. In FIG. 3, the power amplifier 20 comprises a bias-voltage generation circuit 130, which is configured to generate the dynamic bias voltage. In FIG. 3, the source node of the field-effect transistor 100 is grounded and the drain node of the field-effect transistor 100 is connected via a transformer 140 to the antenna 25. However, other configurations are possible as well within the scope of the present disclosure.

Figure 4:
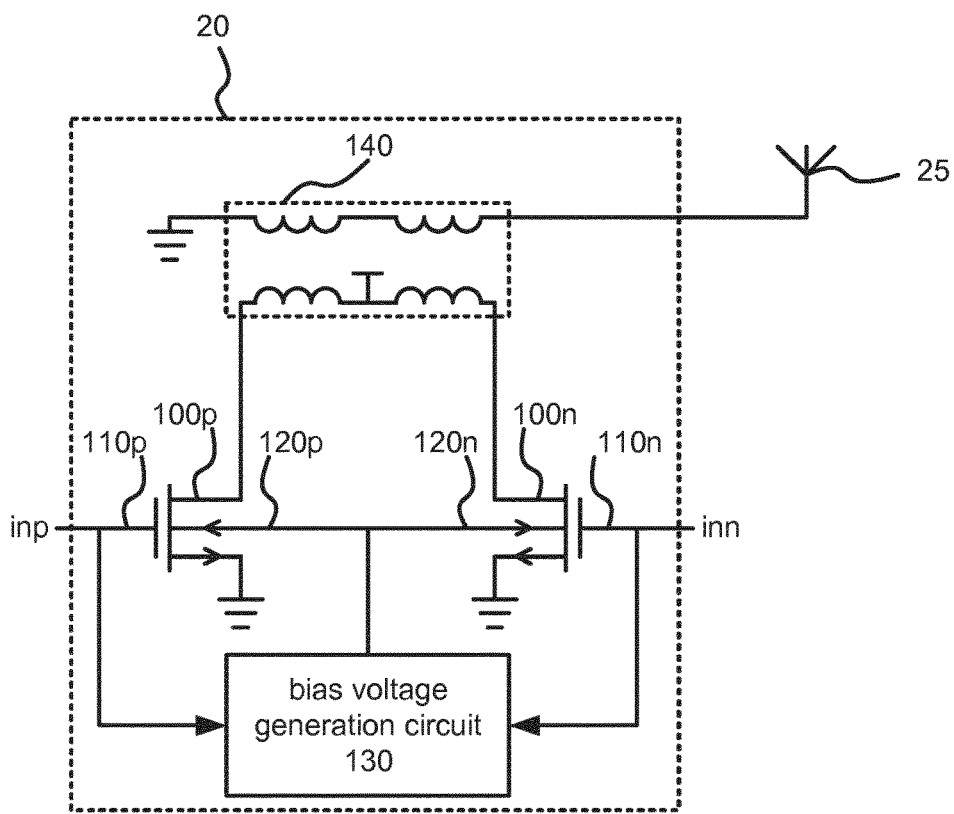

In FIG. 3, the power amplifier 20 comprises a single field-effect transistor 100. That is, FIG. 3 shows a single-ended power amplifier 20. More generically, according to embodiments of the present disclosure, the power amplifier 20 comprises at least one field-effect transistor configured to receive an input voltage at the gate terminal and a dynamic bias voltage at the bulk terminal. FIG. 4 illustrates an embodiment where the at least one field-effect transistor is a differential pair of field-effect transistors 100n and 100p. FIG. 4 thus shows a differential power amplifier 20. In FIG. 4, the gate terminal 110n of the field-effect transistor 100n is connected to a negative input "inn" to receive a negative component of the differential input voltage. Similarly, in FIG. 4, the gate terminal 110p of the field-effect transistor 100p is connected to a positive input "inp" to receive a positive component of the differential input voltage. Furthermore, in FIG. 4, the bulk terminals 120n and 120p of the field-effect transistors 100n and 100p are configured to receive the same dynamic bias voltage. In FIG. 4, the source nodes of the field-effect transistors 100n and 100p are grounded and the drain nodes of the field-effect transistors 100n and 100p are connected via a differential transformer 140 to the antenna 25. However, other configurations are possible as well within the scope of the present disclosure.

Figure 5:
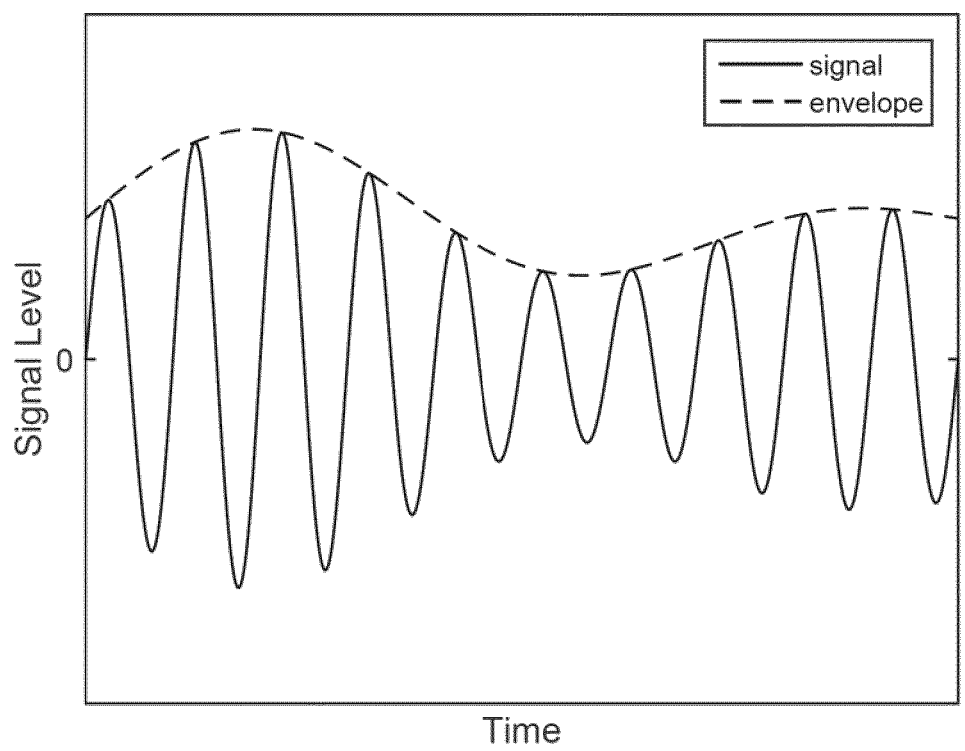
FIG. 5 is a signal plot.

FIG. 5 illustrates an example of an amplitude-modulated oscillating signal, which may be an input signal to the power amplifier 20. This signal is labeled "signal" in the figure. FIG. 5 also illustrates the envelope (labeled "envelope") of the amplitude-modulated oscillating signal. According to embodiments, the input voltage to the power amplifier 20 (e.g. the single-ended input voltage of FIG. 3 or differential input voltage of FIG. 4) is a linear function of an input signal. Furthermore, according to embodiments, the bias-voltage generation circuit 130 is configured to generate the dynamic bias voltage as a function of the envelope of the input signal.

The gain of a power amplifier is ideally linear up the point when the amplifier saturates. However, prior to saturating in power, the amplifier typically starts dropping in gain. At some input power the gain is 1 dB lower than the ideal curve. This point is called the 1 dB compression point. By varying the dynamic bias voltage applied to the bulk node 120, 120n, 120p of the at least one field-effect transistor 100, 100n, 100p based on the envelope of the input signal, it is possible to vary the threshold voltage of the at least one field-effect transistor 100, 100n, 100p such that the 1 dB compression point is improved compared with a constant bulk voltage.

According to embodiments illustrated in the figures, the at least one field-effect transistor 100, 100n, 100p is an NMOS transistor. According to such embodiments, the dynamic bias voltage for the bulk node 120, 120n, 120p varies as an increasing function of the envelope, so as to decrease the threshold voltage as the envelope increases. In other embodiments, the at least one field-effect transistor 100, 100n, 100p is a PMOS transistor. According to such embodiments, the dynamic bias voltage for the bulk node 120, 120n, 120p varies as a decreasing function of the envelope, so as to increase the (negative) threshold voltage as the envelope increases. In the following description, the NMOS case is considered, but a skilled person would readily understand how these considerations would be like in the complementary PMOS case.

The inventors have realized that if the bulk node voltage varies as a linear function of the envelope, there is a relatively high risk that either the bulk node voltage is increased too early as input power goes up, which will introduce problems with gain expansion for lower input power, or too late for higher input powers, which would lead to insufficient compensation of the gain at higher input powers in order to significantly improve the 1 dB compression point. In this context, we consider a voltage V to vary linearly with the envelope e if it can be expressed as $V = c \cdot e + V_{offset}$, where $V_{offset}$ is a constant voltage and c is a constant. It can be noted that the zero reference electrical potential level can always be selected such that $V_{offset} = 0$, i.e. $V = c \cdot e$. The inventors have further realized that by allowing the dynamic bias voltage to vary as a nonlinear function of the envelope, the threshold voltage can be increased early enough, for increasing input power, to significantly improve the 1 dB compression point, while avoiding the above-mentioned gain expansion for lower input powers. Therefore, according to embodiments, the bias-voltage generation circuit 130 is configured to generate the dynamic bias voltage as a nonlinear function of the envelope of the input signal.

Figure 6:
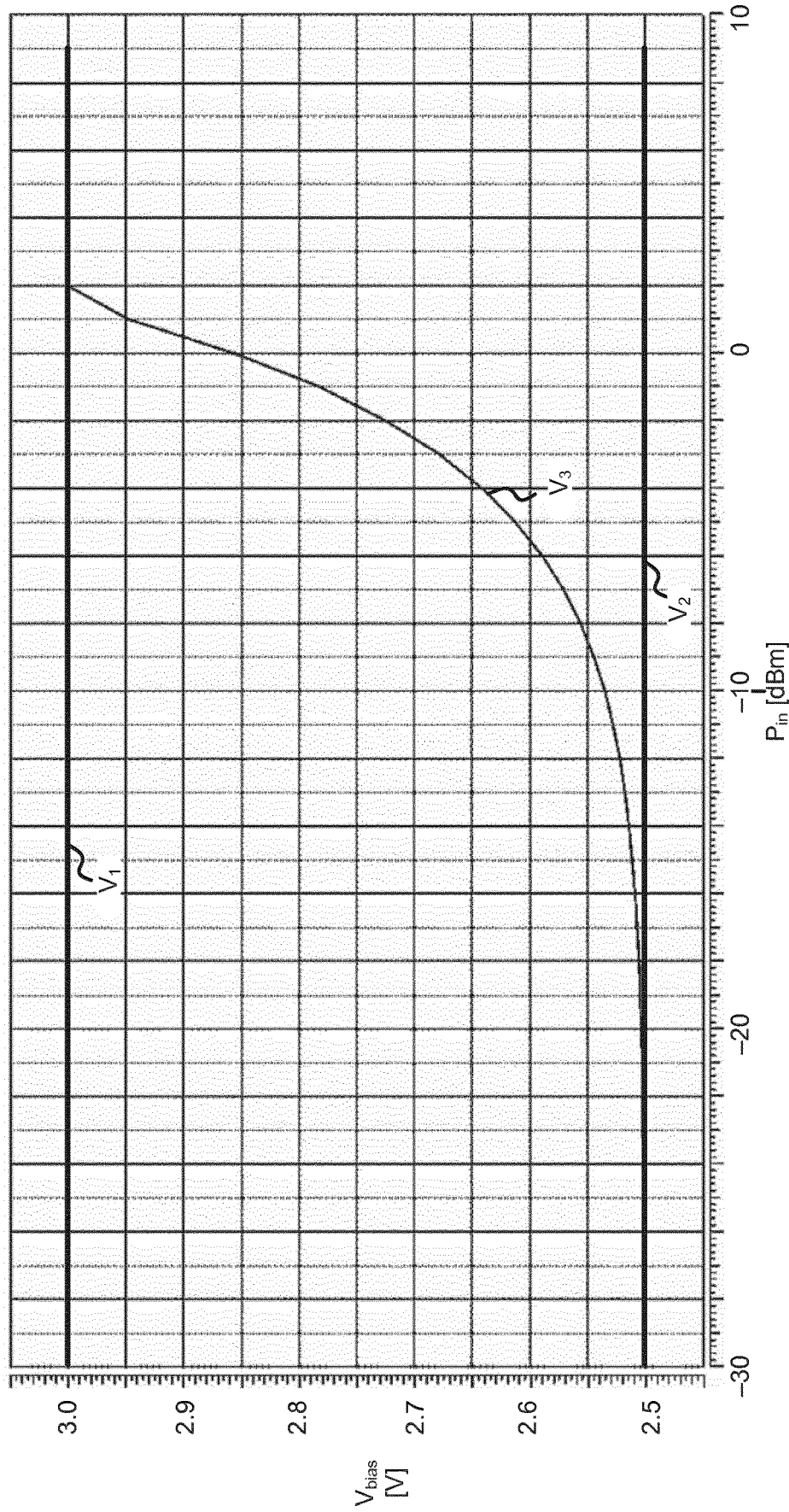
FIGS. 6-7 show plots of simulation results.
Figure 7:
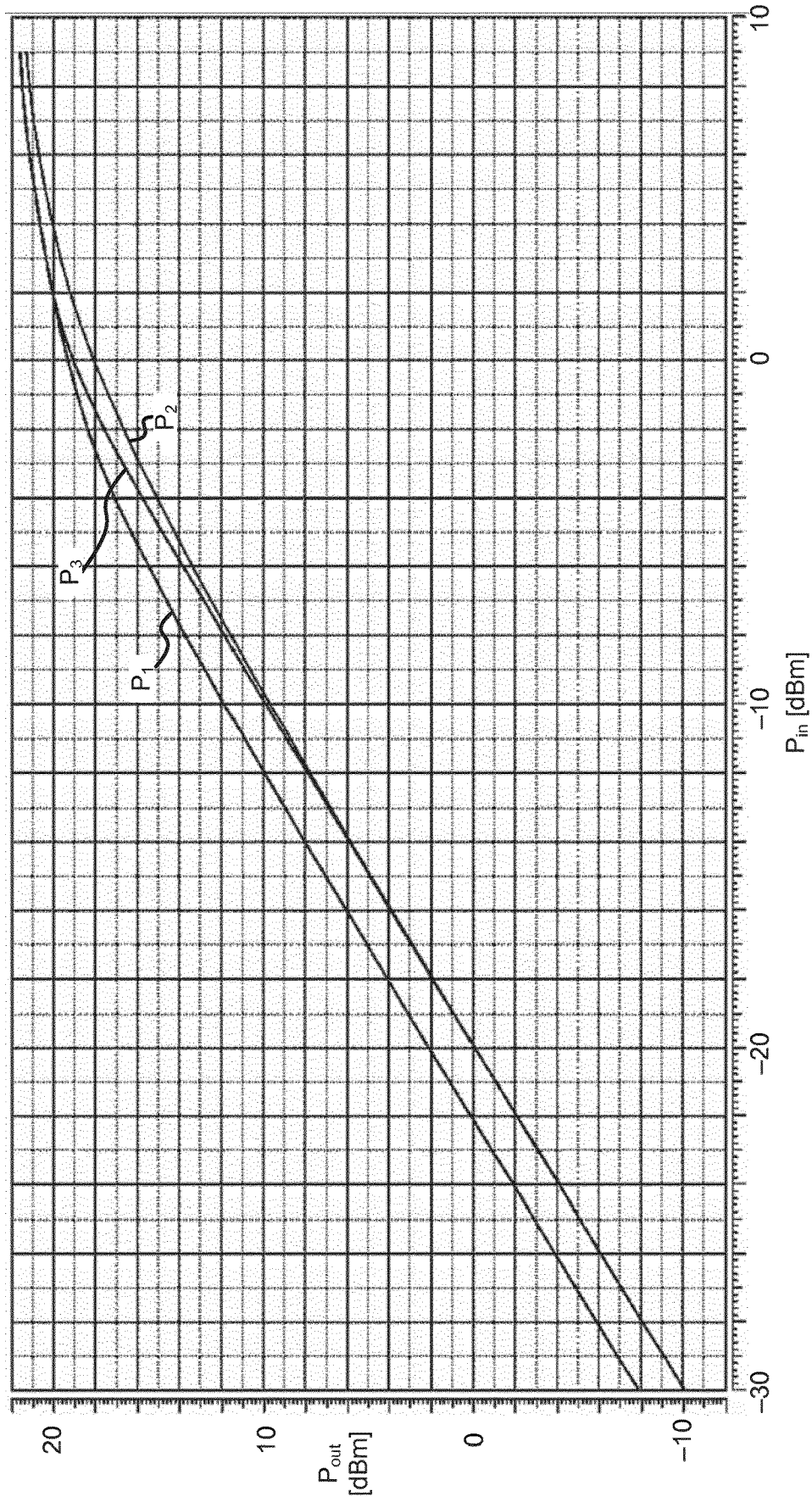

FIGS. 6-7 illustrate how the input power vs output power relationship is influenced by different ways of biasing the bulk node 120n, 120p of the differential pair of NMOS transistors 100n, 100p in FIG. 4 according to simulation examples. It should be noted that the quantitative results depend on process parameters for a given manufacturing process and selection of transistor dimensions. Hence, the quantitative results vary between different power amplifier designs. What is more generic is the qualitative behavior of the simulation results, discussed further below.

FIG. 6 illustrates three different alternatives for biasing the bulk node 120n, 120p of the differential NMOS pair 100n, 100p. FIG. 7 illustrates the corresponding resulting input power-output power relationship. FIG. 6 illustrates the bias voltage of the bulk node 120n, 120p as a function of the input power, which itself is proportional to the square of the envelope. It should be noted that a logarithmic (dBm) scale is used for the input power in FIG. 6. According to a first and a second example, the bias voltage is set constant to 3.0 V (labeled $V_1$) and 2.5 V (labeled $V_2$), respectively. The corresponding input power-output power relationships are labeled $P_1$ and $P_2$, respectively, in FIG. 7. According to a third example, labeled $V_3$ in FIG. 6, the bias voltage varies nonlinearly with the envelope of the input signal between the (constant) $V_2$ curve, for low input powers, and the (also constant) $V_1$ curve for higher input powers. In FIG. 6, the bias voltage according to the $V_3$ curve has a quadratic dependence on the envelope (until it hits the $V_1$ curve). The corresponding input power-output power relationship is labeled $P_3$ in FIG. 7. From a pure ocular inspection of the curves in FIG. 7, it can be deduced that, using the dynamic bias voltage given by the $V_3$ curve in FIG. 6 results in an increased compression point compared with both of the constant alternatives $V_1$ and $V_2$.

The $V_3$ curve in FIG. 6 starts at a first voltage (2.5 V) for low values of the envelope and increases towards a second value (3.0 V) with increasing envelope. Hence, the nonlinear function can be described as an increasing function generating a first voltage at a first envelope level and a second higher voltage at a second higher envelope level. It can also be observed from FIG. 6 that the rate of increase of the $V_3$ curve increases for an increasing envelope, such that the curve "bends upwards" towards the second voltage level. Mathematically, this can be expressed in terms of that the increasing nonlinear function is a convex function. Hence, in accordance with some embodiments, wherein the at least one transistor 100, 100n, 100p is an NMOS transistor, the nonlinear function is an increasing convex function between a first envelope level and a second, higher, envelope level.

For embodiments wherein the at least one transistor 100, 100n, 100p is a PMOS transistor, a corresponding nonlinear curve (i.e. corresponding to $V_3$) would start at a first voltage for low values of the envelope and decrease towards a second, lower, voltage with increasing envelope. The rate of decrease of this curve would increase for an increasing envelope, such that the curve "bends downwards" towards the second voltage level. Mathematically, this can be expressed in terms of that the decreasing nonlinear function is a concave function. Hence, in accordance with some embodiments, wherein the at least one transistor 100, 100n, 100p is a PMOS transistor, the nonlinear function is a decreasing concave function between a first envelope level and a second, higher, envelope level.

Figure 8:
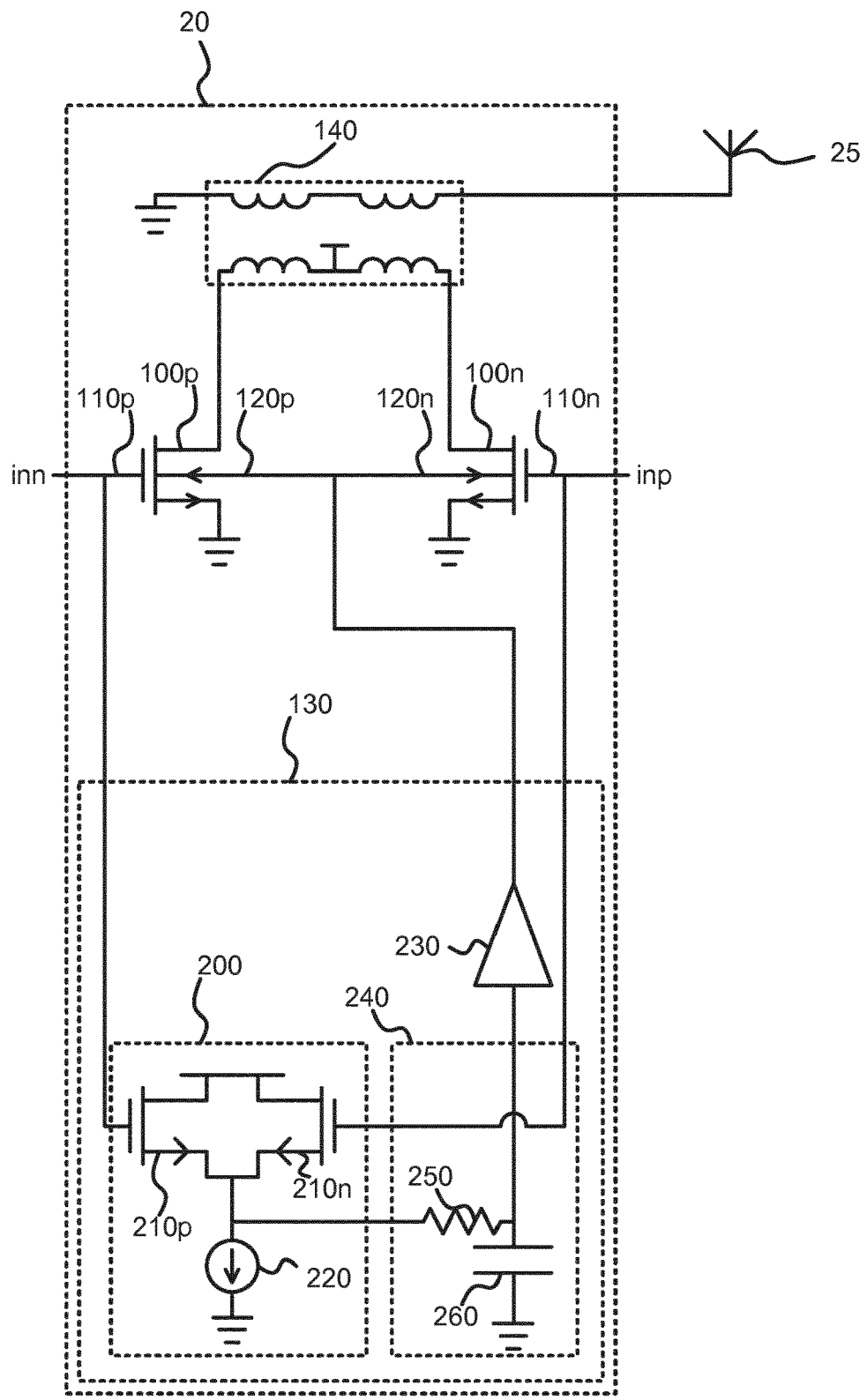
FIG. 8 illustrates an embodiment of a power amplifier.

According to some embodiments, the bias-voltage generation circuit 130 is an analog circuit. An example of this is provided in FIG. 8, showing a circuit schematic according to an embodiment. As illustrated in FIG. 8, the bias-voltage generation circuit 130 may comprise a rectifier circuit 200 configured to generate a rectified input voltage. In the embodiment illustrated in FIG. 8, the rectifier circuit 200 comprises differential transistor pair 210n, 210p. The transistor 210n is configured to receive the negative component of the differential input voltage at its gate terminal. Similarly, the transistor 210p is configured to receive the positive component of the differential input voltage at its gate terminal. Furthermore, in FIG. 8, the transistors 210n, 210p have their drain terminals connected to a common node, to which a bias current source 220 is also connected for providing a bias current. The rectified input voltage is generated at said common node. This type of rectifier circuit has an inherent nonlinearity that can be utilized to generate the dynamic bias voltage as a nonlinear function of the envelope of the input signal. It should be noted that other rectifier topologies than that illustrated in FIG. 8 can be used as well, e.g. rectifier topologies using diode bridges, etc. Furthermore, in FIG. 8, the bias voltage generation circuit 130 comprises an amplifier circuit 230 operatively connected to the rectifier circuit 200 and configured to generate the dynamic bias voltage based on the rectified input voltage.

As illustrated in FIG. 8, the bias voltage generation circuit 130 may optionally comprise a filter circuit 240 connected between the rectifier circuit 200 and the amplifier circuit 230. The filter circuit 240 may be configured to suppress high-frequency content of the rectified input voltage, such as components at the radio frequency (RF) and harmonics thereof, while passing lower-frequency content of the rectified input voltage corresponding to the envelope of the input signal. As illustrated in FIG. 8, the filter 240 may, for instance, be implemented as a simple RC-link, comprising a resistor 250 and a capacitor 260.

Figure 9:
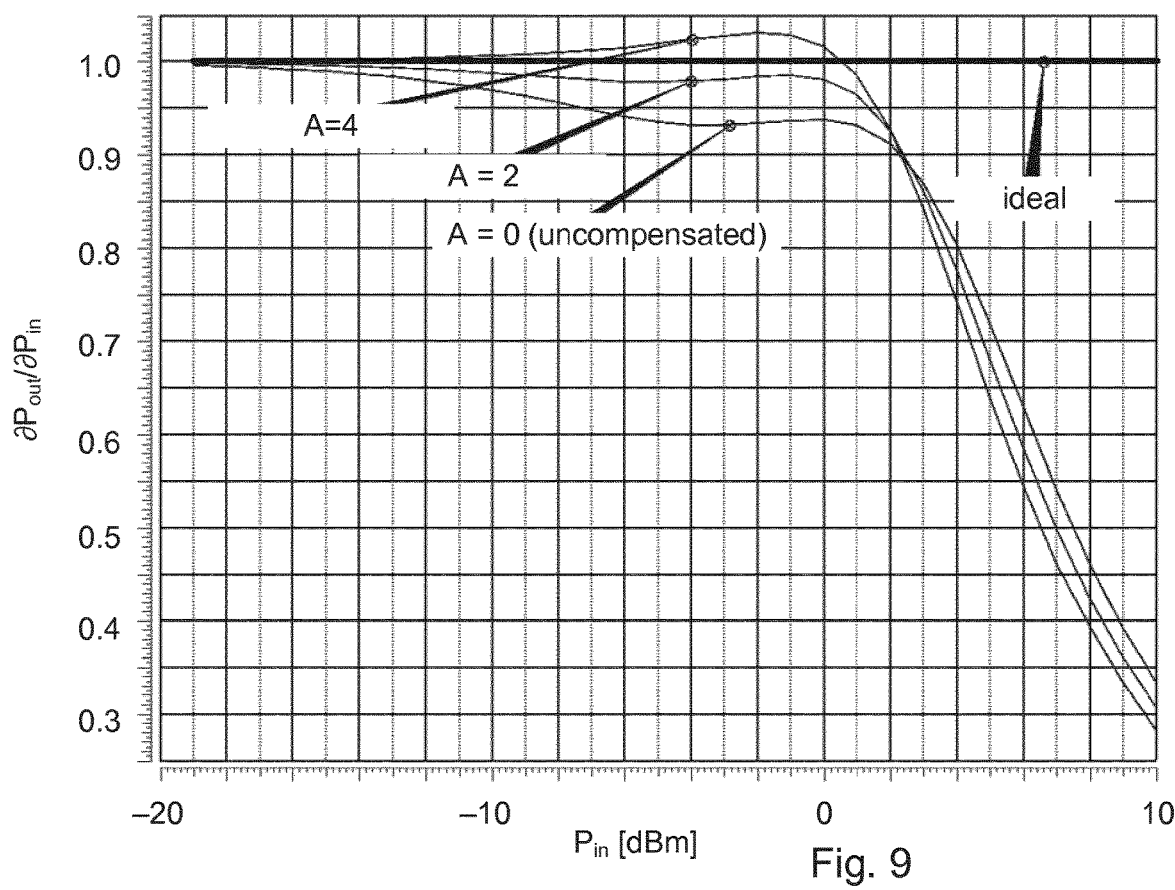
FIGS. 9-10 show plots of simulation results.
Figure 10:
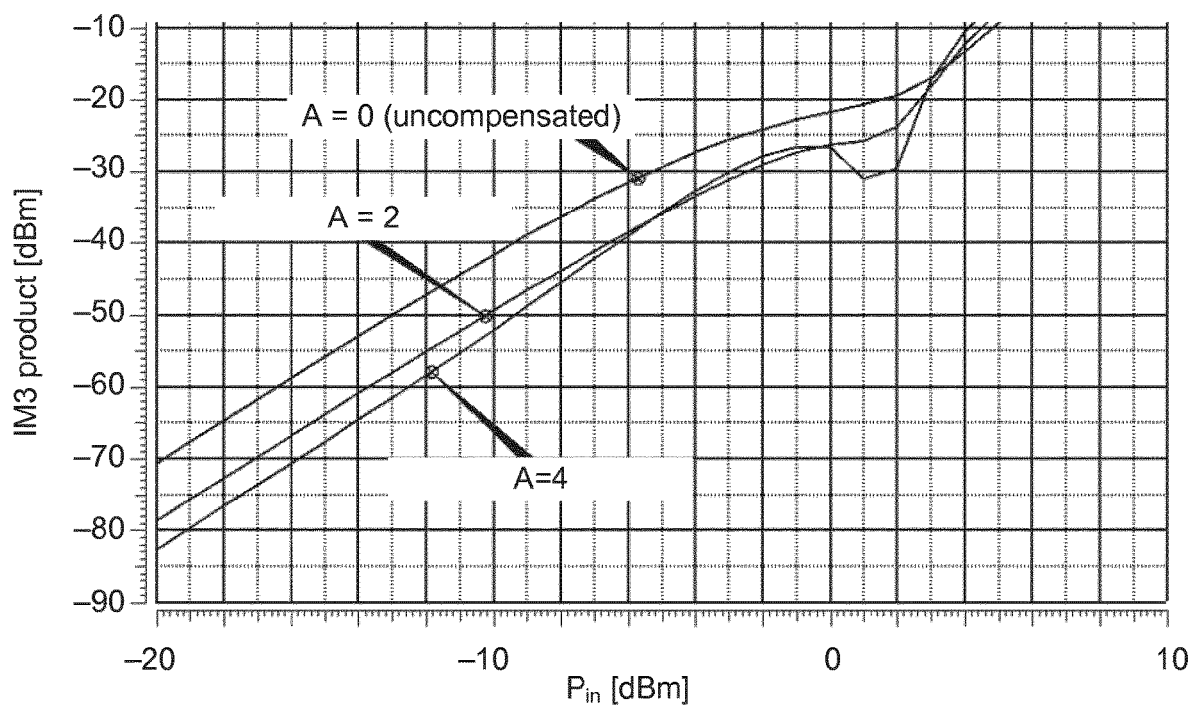

FIGS. 9-10 illustrates how the gain A of the amplifier 230, shown in FIG. 8, can influence the linearity of the power amplifier 20 according to simulation examples. As mentioned above with reference to FIGS. 6-7, it should be noted that the quantitative results depend on process parameters for a given manufacturing process and selection of transistor dimensions. Hence, again, the quantitative results vary between different power amplifier designs. What is more generic is the qualitative behavior of the simulation results, discussed further below.

FIG. 9 shows the derivative of the power, in logarithmic scale, of the fundamental tone with respect to the input power, also in logarithmic scale. For an ideal power amplifier, the output power, in linear scale, is proportional to the input power in linear scale, i.e.

$$P_{out}^{lin} = A_P P_{in}^{lin}$$

where $P_{out}^{lin}$ is the output power in linear scale, $A_P$ is the power gain, and $P_{in}^{lin}$ is the input power in linear scale. In logarithmic scale $$P_{out}^{log} = \log_{10} P_{out}^{lin} = \log_{10} A_P + \log_{10} P_{in}^{lin} = \log_{10} A_P + P_{in}^{log}$$

where $P_{out}^{log}$ is the output power in logarithmic scale and $P_{in}^{log}$ is the input power in logarithmic scale. Thus, for this ideal power amplifier, said derivative is 1 for all input power levels. The 10 logarithm was used above as an example, but it is readily understood that the ideal derivative would be 1 regardless of what logarithm is used, or for instance if the powers, in logarithmic scale, are expressed in a "dB unit" such as dBm. In FIG. 9, the ideal value of 1 is indicated in the plot as well for reference. The plot labeled A=0 corresponds to a static, constant, bulk bias voltage, following the $V_1$ curve in FIG. 6. We refer to this as an uncompensated case. The curves labeled A=2 and A=4 show the simulation results when the gain of the amplifier 230 is 2 and 4, respectively. As can be seen, up to, and slightly above, 0 dBm of input power, the cases with A=2 and A=4 are both closer to the ideal curve than the uncompensated case. For A=2, the curve is below the ideal curve, and for A=4, the curve is above the ideal curve. Hence, for any value of A between 2 and 4, the result would be closer to the ideal curve than the uncompensated case (for input powers up to and slightly above 0 dBm). The best result, depending on what metric is used to determine closeness to the ideal curve, is achieved for some value of A between 2 and 4.

FIG. 10 show similar plots for the third-order intermodulation (IM3) product. From these plots, it can be observed that for A=2 and A=4, the IM3 product is about 5-10 dB lower than for the uncompensated case, again for input power up to and slightly above 0 dBm.

Figure 11:
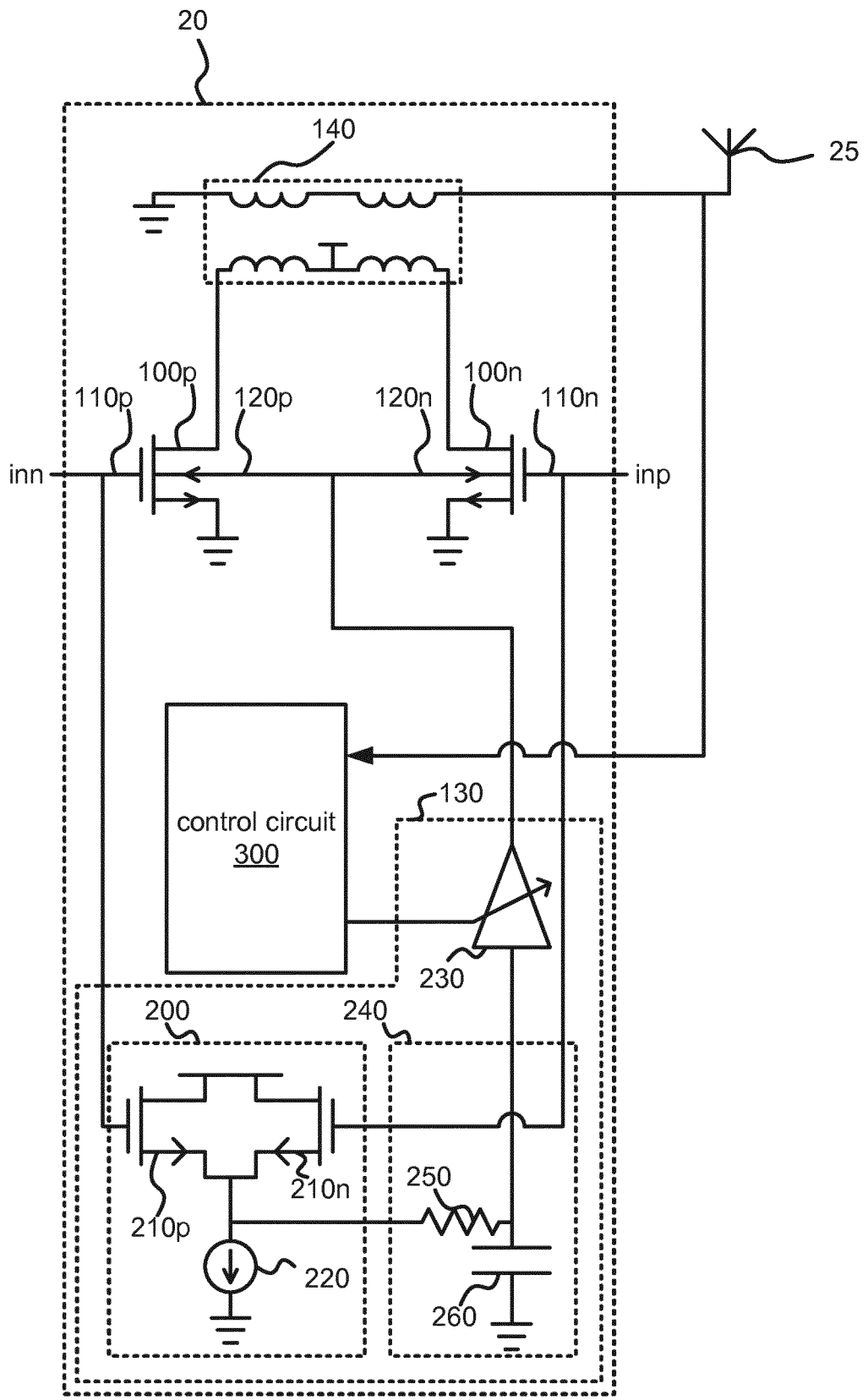
FIGS. 11-12 illustrate embodiments of a power amplifier.

To facilitate fine tuning of the performance of embodiments of the power amplifier 20, the amplifier circuit 230 may be a variable-gain amplifier (VGA) circuit. The power amplifier 20 may further comprise a control circuit configured to tune the gain of the amplifier circuit 230. An example of such an embodiment is illustrated in FIG. 11. In FIG. 11, the power amplifier 20 comprises a control circuit 300 configured to tune the gain of the amplifier circuit 230. The control circuit 300 may, for instance, be configured to measure the signal output from the power amplifier 20, as illustrated with an arrow from the antenna 25 to the control circuit 300 in FIG. 11, e.g. in order to estimate or determine the IM3 product of the signal output from the power amplifier 20, or some other metric of the nonlinearity of the power amplifier 20. The control unit 300 may e.g. comprise a transmitter observation receiver (TOR) configured to measure the signal output from the power amplifier 20. Furthermore, the control unit 300 may be configured to adjust the gain of the VGA 130 to reduce the observed metric of nonlinearity. For example, the control unit 300 may be configured to test a number of gain settings and select the one that gives the best nonlinearity metric, e.g. the lowest IM3 product. For instance, the control unit 300 may be configured to test a gain setting that is slightly higher than the current gain setting and a gain setting that is slightly lower than the current gain setting, and thereby be able to determine whether the gain should be increased or decreased, or potentially left as is. This process may be iterated as needed, e.g. at regular intervals, or when the control unit 300 observes that an adjustment is needed, e.g. because the measured nonlinearity metric exceeds a threshold.

Figure 12:
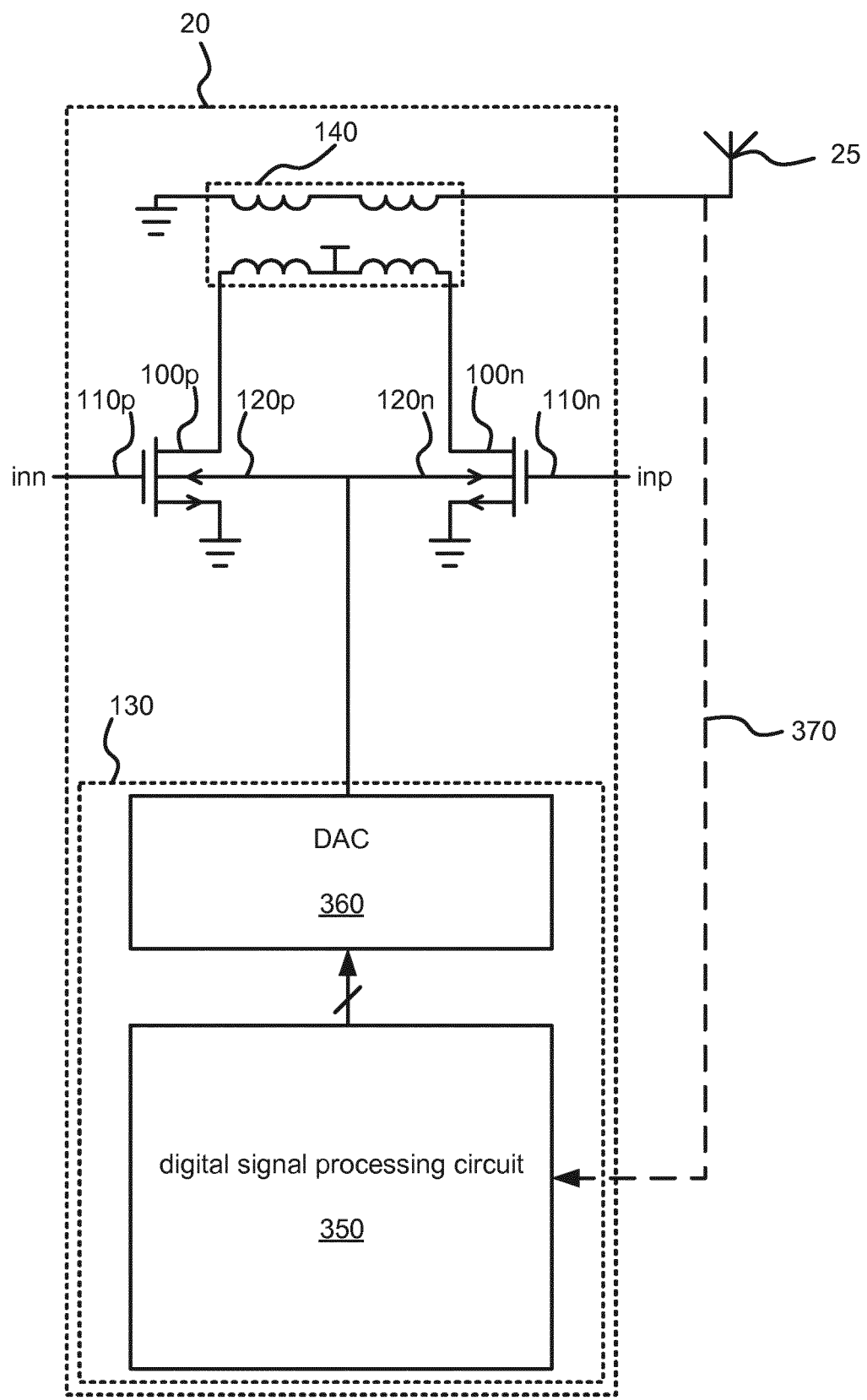

According to some embodiments, the dynamic bias voltage is generated by means of digital signal processing and converted to an analog voltage by means of a digital-to-analog converter. An example of such an embodiment is illustrated in FIG. 12. In this embodiment, the bias-voltage generation circuit 130 comprises a digital signal-processing circuit 350. The digital signal-processing circuit 350 is configured to apply the nonlinear function, to the envelope, in the digital domain to generate a digital bias signal. The nonlinear function may for example be a polynomial, such as $$f(e) = \Sigma_{j=0}^{k} a_j e^j$$

where f denotes the nonlinear function, e denotes the envelope, the $a_j$:s are coefficients, and k is the order of the polynomial. Furthermore, in FIG. 12, the bias-voltage generation unit 130 comprises a digital-to-analog converter 360. The digital-to-analog converter 360 is configured to convert the digital bias signal to the analog domain to generate the dynamic bias voltage.

As indicated in FIG. 12 with an optional connection 370 to the antenna 25, the digital signal processing circuit 350 may, in some embodiments, be configured to measure the signal output from the power amplifier 20, e.g. in order to estimate or determine the IM3 product of the signal output from the power amplifier 20, or some other metric of the nonlinearity of the power amplifier 20. This is similar to what is presented above regarding the control unit 300 in FIG. 11. The digital signal-processing circuit 350 may e.g. comprise a TOR configured to measure the signal output from the power amplifier 20. Furthermore, the digital signal-processing circuit 350 may be configured to adjust coefficients of nonlinear function, such as the coefficients $a_j$ mentioned above, to reduce the observed metric of nonlinearity. For example, the digital signal-processing circuit 350 may be configured to test a number of coefficient settings and select the one that gives the best nonlinearity metric, e.g. the lowest IM3 product. For instance, the digital signal-processing circuit 350 may be configured to test coefficient settings in a neighborhood of a current coefficient setting e.g. according to some gradient or steepest descent method, and thereby be able to determine in what direction to adjust the coefficients, or potentially leave them as they are. This process may be iterated as needed, e.g. at regular intervals, or when the digital signal-processing circuit 350 observes that an adjustment is needed, e.g. because the measured nonlinearity metric exceeds a threshold.

It should be noted that the envelope can be derived in the digital domain from the baseband signal. Hence, in some embodiments, the digital signal processing circuit 350 is configured to derive the envelope in the digital domain from the digital baseband signal. The digital signal-processing circuit 350 may e.g. be configured to receive the digital baseband signal from a digital baseband processor (not shown) of the transmitter circuit 10.

In some embodiments, the digital signal processing circuit 350 is configured to receive the envelope from the digital baseband circuit.

In some embodiments, the digital signal-processing circuit 350 is, or is comprised in, said digital baseband processor.

In other embodiments, the digital signal processing circuit 350 may be configured to derive the envelope from the RF signal input to the inputs "in" (FIG. 3) or "inn" and "inp" (FIGS. 4 and 12) of the power amplifier. For example, the digital signal processing circuit 350 may comprise one or more analog-to-digital converters (not shown) configured to digitize the RF signal. The digital signal-processing circuit 350 may be configured to derive the envelope from the digitized RF signal.

In any of the embodiments described above, the transistors 100, 100n, and 100p may be advantageously fabricated in a silicon-on-insulator manufacturing process technology.

Figure 13:
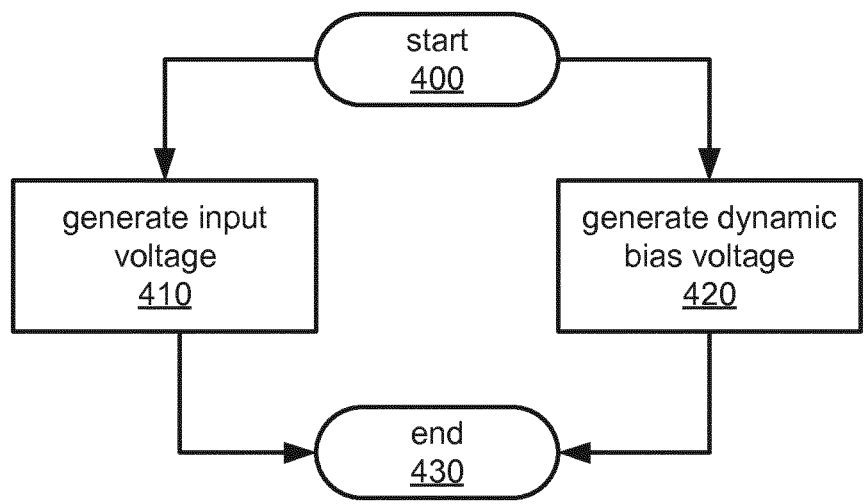
FIG. 13 is a flowchart.

According to some embodiments, there is provided a method for controlling the power amplifier 20 described above with reference to various embodiments. A flowchart of such a method is provided in FIG. 13. The operation of the method is commenced in step 400. In parallel steps 410 and 420, the input voltage to the power amplifier 20 and the dynamic bias voltage are simultaneously generated continually, until the operation is ended in step 430. Step 410 comprises generating the input voltage as a linear function of an input signal, as has been described above with reference to embodiments of the power amplifier 20. Step 420 comprises generating, e.g. by the bias-voltage generation circuit 130, the dynamic bias voltage as a nonlinear function of an envelope of the input signal, as has been described above with reference to embodiments of the power amplifier 20.

The present disclosure has been presented above with reference to specific embodiments. However, other embodiments than the above described are possible within the scope of the disclosure. Different method steps than those described above, performing the method by hardware or software, may be provided within the scope of the disclosure. The different features and steps of the embodiments may be combined in other combinations than those described.

The invention claimed is:

1. A power amplifier, for a transmitter circuit, comprising:
at least one field-effect transistor having a gate terminal and a bulk terminal, wherein the at least one field-effect transistor is configured to receive an input voltage at the gate terminal and a dynamic bias voltage at the bulk terminal; and
a bias-voltage generation circuit,
wherein the input voltage is a linear function of an input signal,
wherein the bias-voltage generation circuit is configured to generate the dynamic bias voltage as a nonlinear function of an envelope of the input signal, and
wherein the bias-voltage generation circuit comprises a digital signal-processing circuit configured to determine a metric of nonlinearity of the power amplifier, and when the determined metric of nonlinearity exceeds a threshold, the digital signal-processing circuit is further configured to adjust coefficients of the nonlinear function, to reduce the determined metric of nonlinearity.

2. The power amplifier of claim 1, wherein either:
the at least one field-effect transistor is an NMOS transistor and the nonlinear function is an increasing function; or
the at least one field-effect transistor is a PMOS transistor and the nonlinear function is a decreasing function.

3. The power amplifier of claim 1, wherein
the digital signal-processing circuit is further configured to apply the nonlinear function in a digital domain to generate a digital bias signal; and
wherein the bias-voltage generation circuit further comprises a digital-to-analog converter configured to convert the digital bias signal to an analog domain to generate the dynamic bias voltage.

4. The power amplifier of claim 1, wherein the at least one field-effect transistor is fabricated in a silicon-on-insulator process technology.

5. The power amplifier of claim 1, wherein the at least one field-effect transistor is a differential pair of field-effect transistors.

6. The power amplifier of claim 1, wherein the nonlinear function is an increasing convex function or a decreasing concave function between a first envelope level and a second, higher, envelope level of the envelope.

7. The power amplifier of claim 1, wherein to adjust the coefficients of the nonlinear function, the digital signal-processing circuit is further configured to test coefficient settings in a neighborhood of a current coefficient setting of the nonlinear function, and wherein the digital signal-processing circuit is further configured to determine a direction to adjust the coefficients of the nonlinear function, based on the testing of the coefficient settings.

8. A transmitter circuit, comprising:
a power amplifier, the power amplifier comprising:
at least one field-effect transistor having a gate terminal and a bulk terminal, wherein the at least one field-effect transistor is configured to receive an input voltage at the gate terminal and a dynamic bias voltage at the bulk terminal; and
a bias-voltage generation circuit,
wherein the input voltage is a linear function of an input signal,
wherein the bias-voltage generation circuit is configured to generate the dynamic bias voltage as a nonlinear function of an envelope of the input signal, and
wherein the bias-voltage generation circuit comprises a digital signal-processing circuit configured to determine a metric of nonlinearity of the power amplifier, and when the determined metric of nonlinearity exceeds a threshold, the digital signal-processing circuit is further configured to adjust coefficients of the nonlinear function, to reduce the determined metric of nonlinearity.

9. The transmitter circuit of claim 8, wherein the nonlinear function is an increasing convex function or a decreasing concave function between a first envelope level and a second, higher, envelope level of the envelope.

10. The transmitter circuit of claim 8, wherein to adjust the coefficients of the nonlinear function, the digital signal-processing circuit is further configured to test coefficient settings in a neighborhood of a current coefficient setting of the nonlinear function, and wherein the digital signal-processing circuit is further configured to determine a direction to adjust the coefficients of the nonlinear function, based on the testing of the coefficient settings.

11. A communication apparatus, comprising:
a transmitter circuit having a power amplifier, the power amplifier comprising:
at least one field-effect transistor having a gate terminal and a bulk terminal, wherein the at least one field-effect transistor is configured to receive an input voltage at the gate terminal and a dynamic bias voltage at the bulk terminal; and
a bias-voltage generation circuit,
wherein the input voltage is a linear function of an input signal,
wherein the bias-voltage generation circuit is configured to generate the dynamic bias voltage as a nonlinear function of an envelope of the input signal, and
wherein the bias-voltage generation circuit comprises a digital signal-processing circuit configured to determine a metric of nonlinearity of the power amplifier, and when the determined metric of nonlinearity exceeds a threshold, the digital signal-processing circuit is further configured to adjust coefficients of the nonlinear function, to reduce the determined metric of nonlinearity.

12. The communication apparatus of claim 11, wherein the communication apparatus is a wireless terminal for a cellular communication system.

13. The communication apparatus of claim 11, wherein the communication apparatus is a radio base station for a cellular communication system.

14. The communication apparatus of claim 11, wherein the nonlinear function is an increasing convex function or a decreasing concave function between a first envelope level and a second, higher, envelope level of the envelope.

15. The communication apparatus of claim 11, wherein to adjust the coefficients of the nonlinear function, the digital signal-processing circuit is further configured to test coefficient settings in a neighborhood of a current coefficient setting of the nonlinear function, and wherein the digital signal-processing circuit is further configured to determine a direction to adjust the coefficients of the nonlinear function, based on the testing of the coefficient settings.

16. A method of controlling a power amplifier for a transmitter circuit, wherein the power amplifier comprises at least one field-effect transistor having a gate terminal and a bulk terminal, and wherein the at least one field-effect transistor is configured to receive an input voltage at the gate terminal and a dynamic bias voltage at the bulk terminal; the method comprising:

generating the input voltage as a linear function of an input signal;

generating the dynamic bias voltage as a nonlinear function of an envelope of the input signal;

determining a metric of nonlinearity of the power amplifier; and adjusting coefficients of the nonlinear function, to reduce the determined metric of nonlinearity, when the determined metric of nonlinearity exceeds a threshold.

17. The method of claim 16, wherein the nonlinear function is an increasing convex function or a decreasing concave function between a first envelope level and a second, higher, envelope level of the envelope.

18. The method of claim 16, wherein adjusting the coefficients of the nonlinear function comprises:

testing coefficient settings in a neighborhood of a current coefficient setting of the nonlinear function; and determining a direction to adjust the coefficients of the nonlinear function, based on the testing of the coefficient settings.

* * * * *